(12) United States Patent
Kim et al.

(10) Patent No.: US 7,791,573 B2
(45) Date of Patent: Sep. 7, 2010

(54) ETCHING SOLUTION FOR MULTIPLE LAYER OF COPPER AND MOLYBDENUM AND ETCHING METHOD USING THE SAME

(75) Inventors: Seong-Su Kim, Annyang-si (KR); Yong-Suk Choi, Seoul (KR); Gee-Sung Chae, Incheon (KR); Gyoo-Chul Jo, Gunpo-si (KR); Oh-Nam Kwon, Suwon-si (KR); Kyoung-Mook Lee, Seoul (KR); Yong-Sup Hwang, Suwon (KR); Seung-Yong Lee, Daejeon (KR)

(73) Assignees: LG Display Co., Ltd, Seoul (KR); Dongwoo Fine-Chem Co., Ltd., Seoul (KR)

( * ) Notice: Subject to any disclaimer, the term of this patent is extended or adjusted under 35 U.S.C. 154(b) by 0 days.

(21) Appl. No.: 12/219,446

(22) Filed: Jul. 22, 2008

(65) Prior Publication Data
US 2008/0286974 A1    Nov. 20, 2008

Related U.S. Application Data

(62) Division of application No. 10/732,346, filed on Dec. 11, 2003, now Pat. No. 7,416,681.

(30) Foreign Application Priority Data

Dec. 12, 2002  (KR) .................. 10-2002-0079211
Nov. 19, 2003  (KR) .................. 10-2003-0082375

(51) Int. Cl.
*G09G 3/36*    (2006.01)
(52) U.S. Cl. .................. 345/87; 438/702; 252/79.1; 349/139
(58) Field of Classification Search .......... 345/87–100, 345/204; 216/96, 97; 252/79; 257/43
See application file for complete search history.

(56) References Cited

U.S. PATENT DOCUMENTS

| 6,703,276 | B2 * | 3/2004 | Alok et al. ............ 438/268 |
| 7,416,681 | B2 * | 8/2008 | Kim et al. ............ 252/79.1 |
| 2001/0008828 | A1 | 7/2001 | Uchikura et al. |
| 2002/0121641 | A1 * | 9/2002 | Alok et al. ............ 257/76 |
| 2003/0125301 | A1 * | 7/2003 | Wolf et al. ............ 514/54 |
| 2004/0118814 | A1 * | 6/2004 | Kim et al. ............ 216/96 |
| 2006/0276339 | A1 * | 12/2006 | Windsor et al. ......... 504/127 |

\* cited by examiner

*Primary Examiner*—Nitin Patel
(74) *Attorney, Agent, or Firm*—McKenna Long & Aldridge (57) ABSTRACT

An etching solution for a multiple layer of copper and molybdenum includes: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and de-ionized water making a total amount of the etching solution 100% by weight.

15 Claims, 12 Drawing Sheets

FIG. 1A

RELATED ART

ETCHING SOLUTION FOR MULTIPLE LAYER OF COPPER AND MOLYBDENUM AND ETCHING METHOD USING THE SAME

This application is a divisional application of application Ser. No. 10/732,346 filed Dec. 11, 2003, now U.S. Pat. No. 7,416,681 which hereby claims the benefits of Korean Patent Application Nos. 2002-79211, filed on Dec. 12, 2002 and 2003-82375, filed on Nov. 19, 2003, which are hereby incorporated by references for all purposes as if fully set forth herein.

BACKGROUND OF THE INVENTION

1. Field of the Invention

The present invention relates to an etching solution for a metal layer, and more particularly, to an etching solution for a copper-molybdenum layer and an etching method using the same.

2. Discussion of the Related Art

In general, in order to form a metal line on a substrate for a semiconductor device, several steps are required such as forming a metal layer on a substrate using sputtering, forming a photoresist (PR) pattern on the metal layer by coating, exposure and development and etching the metal layer with a cleaning step before and/or after each of the steps. The metal layer is patterned using the PR pattern as an etching mask during the etching step. A dry etching method using plasma or wet etching method using an etching solution may be used for the etching step.

Recently, the resistance of a metal layer has been an issue for semiconductor devices. Resistance of a metal layer is a crucial factor for a RC (resistance-capacitance) signal delay component in semiconductor devices. Likewise, resistance of metal layers should be considered to increase the panel size and resolution of thin film transistor liquid crystal display (TFT-LCD) devices. For a large-size TFT-LCD device, the RC signal delay should be reduced and a material having low resistivity should be developed. In general, metals such as chromium (Cr) (resistivity of about $12.7 \times 10^{-8}$ $\Omega$m), molybdenum (Mo) (resistivity of about $5 \times 10^{-8}$ $\Omega$m), aluminum (Al) (resistivity of about $2.65 \times 10^{-8}$ $\Omega$m) and alloys thereof have been used for the metal layers of TFT-LCD devices. However, those metals are not suitable for gate and data lines of a large-size TFT-LCD device due to their high resistance. As a result, copper (Cu) has been suggested as a material for a metal line. Copper (Cu) has a lower resistivity than aluminum (Al) and chromium (Cr), and has other advantages for the environment. However, copper has disadvantages with respect to the photolithographic process, which includes PR coating and patterning steps. Moreover, copper has a poor adhesion to an insulating layer including silicon (Si).

To overcome the disadvantages of a copper (Cu) single layer, a multiple layer including copper (Cu) has been suggested. For example, a multiple layer of copper (Cu) and titanium (Ti) has been evaluated as a metal line for a large-size TFT-LCD device. An etching solution for the multiple layer of copper (Cu) and titanium (Ti) has already exist and several other etching solutions have been suggested. However, since the etching solution for the multiple layer of copper (Cu) and titanium (Ti) includes fluoric ion due to a chemical property of titanium (Ti), layers having silicon in TFT-LCD devices (e.g., a glass substrate, an active layer of silicon, an insulating layer of silicon nitride ($SiN_x$) or silicon oxide ($SiO_2$)) are also etched. This undesired etching of the layers including silicon complicates the fabricating process of the TFT-LCD devices.

Accordingly, a multiple layer of copper (Cu) and molybdenum (Mo) is suggested. The multiple layer of copper (Cu) and molybdenum (Mo) may have properties equal to or better than the multiple layer of copper (Cu) and titanium (Ti) by controlling a thickness ratio. Moreover, since fluoric ions do not have a direct influence on the etching of the multiple layer of copper (Cu) and molybdenum (Mo), only a small amount of fluoric ions may be added to an etching solution for the multiple layer of copper (Cu) and molybdenum (Mo) such that a layer including silicon is not etched.

An etching solution including phosphoric acid, nitric acid and acetic acid for the multiple layer including copper (Cu) is disclosed in a published patent No. KP 1999-0017836, and an etching solution including iron chloride (III) hexa-hydride and hydrofluoric acid for a multiple layer including copper (Cu) is disclosed in a published patent No. KP 2000-0032999. However, when these etching solutions are used to etch a multiple layer of copper (Cu) and molybdenum (Mo), several drawbacks exist. First, etching speed is too high to control the etching step so that process margin is insufficient. Second, since a taper angle of the cross-sectional profile of the etched multiple layer is equal to or greater than about 90°, device defects or inferiority may occur during a subsequent process. Third, straightness of the etched multiple layer is not good. Fourth, when the etching solution including iron chloride (III) hexa-hydride and hydrofluoric acid is used, a layer including silicon is undesirably etched as in the case of the etching solution for a multiple layer of copper (Cu) and titanium (Ti).

Figure 1A:
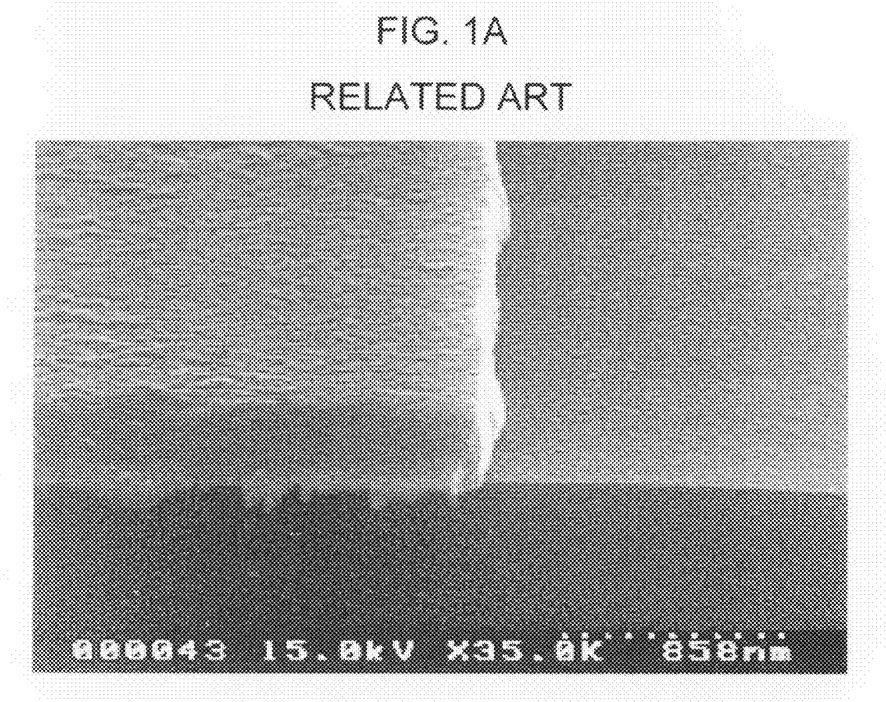
FIG. 1A is a perspective scanning electron microscope (SEM) image showing a pattern of copper (Cu) and molybdenum (Mo) formed by etching with an etching solution including phosphoric acid, nitric acid and acetic acid.
Figure 1B:
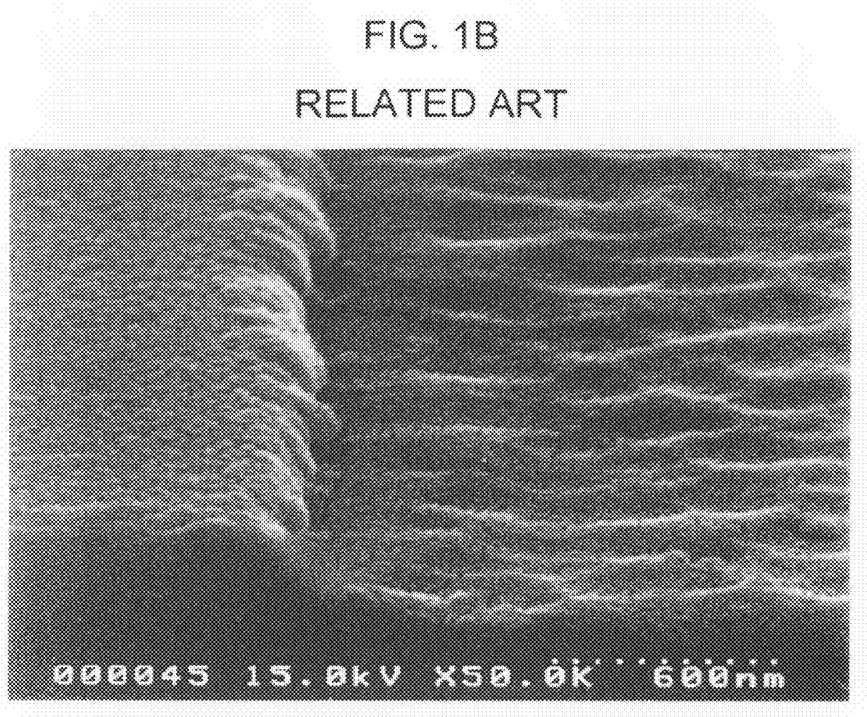
FIG. 1B is a perspective scanning electron microscope (SEM) image showing a pattern of copper (Cu) and molybdenum (Mo) formed by etching with an etching solution including iron chloride (III) hexa-hydride and hydrofluoric acid.

FIG. 1A is a perspective scanning electron microscope (SEM) image showing a pattern of copper (Cu) and molybdenum (Mo) formed by etching with an etching solution including phosphoric acid, nitric acid and acetic acid, and FIG. 1B is a perspective scanning electron microscope (SEM) image showing a pattern of copper (Cu) and molybdenum (Mo) formed by etching with an etching solution including iron chloride (III) hexa-hydride and hydrofluoric acid. As shown in FIGS. 1A and 1B, the pattern of copper (Cu) and molybdenum (Mo) has a poor profile and a poor straightness. Especially, in FIG. 1B, the glass substrate has a rough top surface because hydrofluoric acid of the etching solution etches the glass substrate which includes silicon.

Another etching solution which includes hydrogen peroxide is suggested for etching a multiple layer of copper (Cu) and molybdenum (Mo). However, the etching solution has a first optimum pH value of about 2 to about 4 for copper (Cu) and a second optimum pH value of about 4 to about 7 for molybdenum (Mo). As a result, the molybdenum (Mo) layer may remain as a residue when the etching solution is controlled to have the first optimum pH value for copper (Cu), and etching speed of the copper (Cu) layer is severely reduced when the etching solution is controlled to have the second optimum pH value for molybdenum (Mo).

Figure 2A:
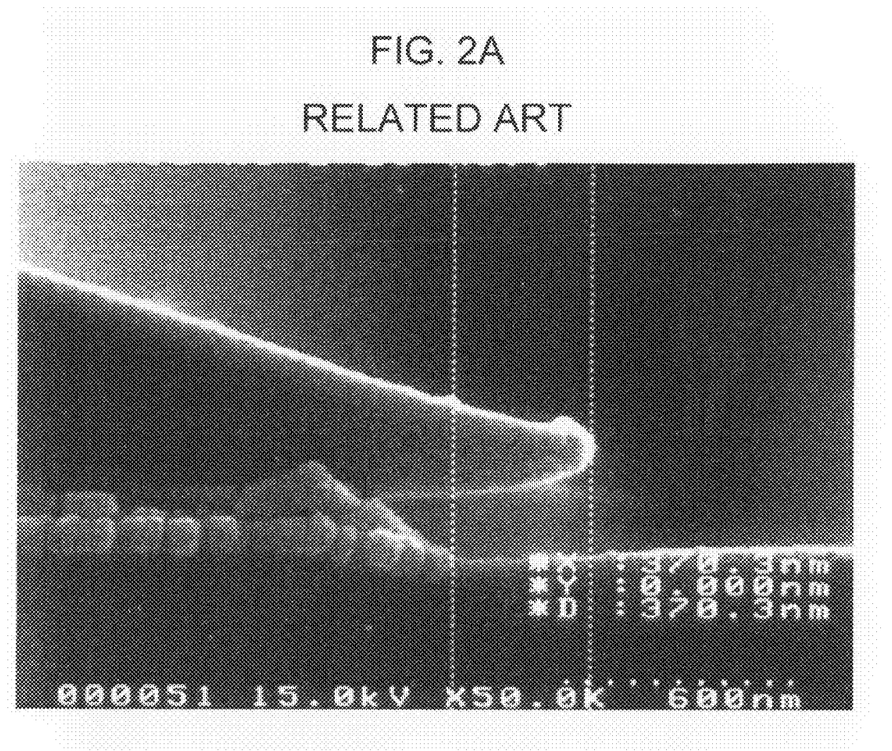
FIG. 2A is a cross-sectional scanning electron microscope (SEM) image showing a pattern of copper (Cu) and molybdenum (Mo) formed by etching with an etching solution including hydrogen peroxide.
Figure 2B:
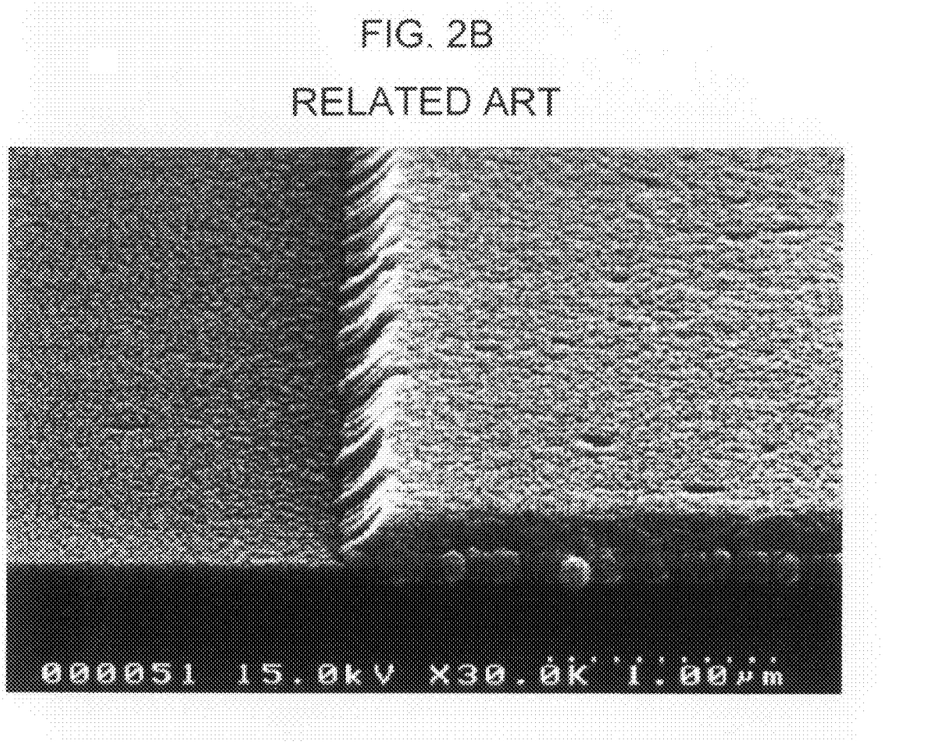
FIG. 2B is a perspective scanning electron microscope (SEM) image showing a pattern of copper (Cu) and molybdenum (Mo) formed by etching with an etching solution including hydrogen peroxide.
Figure 2C:
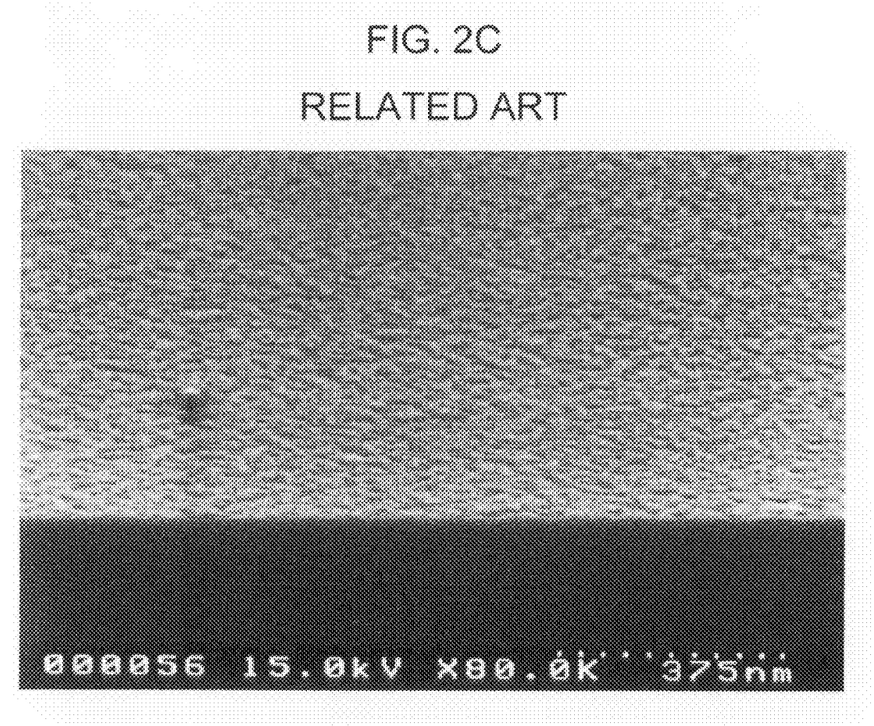
FIG. 2C is a perspective scanning electron microscope (SEM) image showing a substrate after etching with an etching solution including hydrogen peroxide.

FIG. 2A is a cross-sectional scanning electron microscope (SEM) image showing a pattern of copper (Cu) and molybdenum (Mo) formed by etching with an etching solution including hydrogen peroxide, FIG. 2B is a perspective scanning electron microscope (SEM) image showing a pattern of copper (Cu) and molybdenum (Mo) formed by etching with an etching solution including hydrogen peroxide, and FIG. 2C is a perspective scanning electron microscope (SEM) image showing a substrate after etching with an etching solution including hydrogen peroxide. As shown in FIGS. 2A and 2B, the pattern of copper (Cu) and molybdenum (Mo) has a relatively good profile and a good straightness. As shown in FIG. 2C, however, a large number of molybdenum (Mo) residues are observed on the substrate because the etching solution having a pH value suitable for copper (Cu) does not etch molybdenum (Mo) completely.

SUMMARY OF THE INVENTION

Accordingly, the present invention is directed to an etching solution for a multiple layer of copper (Cu) and molybdenum (Mo) that substantially obviates one or more of problems due to limitations and disadvantages of the related art.

An advantage of the present invention is to provide an etching solution that etches a multiple layer of copper (Cu) and molybdenum (Mo) almost without molybdenum (Mo) residues, and an etching method using the same.

Another advantage of the present invention is to provide an etching solution for a multiple layer of copper (Cu) and molybdenum (Mo) that provides a controllable etching speed, a taper angle of about 30° to about 60°, an excellent straightness, a long lifetime and a pH value of about 2 to about 4 for copper (Cu), and an etching method using the same.

Another advantage of the present invention is to provide an etching solution for copper (Cu) that has low resistivity and prevents environmental pollution.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an etching solution for a multiple layer of copper and molybdenum includes: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and de-ionized water making a total amount of the etching solution 100% by weight.

In another aspect of the present invention, an etching method for a multiple layer of copper and molybdenum includes: forming the multiple layer of copper and molybdenum on a substrate; forming a photoresist pattern on the multiple layer; and etching the multiple layer with an etching solution including: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and a de-ionized water making a total amount of the etching solution 100% by weight.

In another aspect, a composition for etching a multiple layer of copper and molybdenum includes: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; and about 0.01% to about 1.0% by weight of a fluoric compound.

In another aspect, a method of fabricating an array substrate for a liquid crystal display device, comprising: forming a gate electrode and a gate line on a substrate; forming a first insulating layer on the gate electrode and the gate line; forming a semiconductor layer on the first insulating layer; and forming source and drain electrodes on the semiconductor layer and a data line crossing the gate line, the source and drain electrode being spaced apart from each other, the source electrode being connected to the data line, the gate line and the data line defining a pixel region, wherein at least one of the gate line and the data line is a multiple layer of copper and molybdenum, and the etching of the multiple layer is performed with an etching solution including: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and a de-ionized water making a total amount of the etching solution 100% by weight.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, example of which is illustrated in the accompanying drawings. Wherever possible, similar reference numbers will be used throughout the drawings to refer to the same or like parts.

A multiple layer of copper (Cu) and molybdenum (Mo) includes a double layer of a lower copper (Cu) layer and an upper molybdenum (Mo) layer, a double layer of a lower molybdenum (Mo) layer and an upper copper (Cu) layer, and a triple layer of a bottom molybdenum (Mo) layer, a middle copper (Cu) layer and a top molybdenum (Mo) layer. In other words, the multiple layer of copper (Cu) and molybdenum (Mo) includes a plurality of copper (Cu) layers and a plurality of molybdenum (Mo) layers alternately interposed therebetween. The structure of the multiple layer of copper (Cu) and molybdenum (Mo) is determined by a material for an upper layer or a lower layer of the multiple layer and adhesion between the layers. The thickness of the copper (Cu) layer and the thickness of the molybdenum (Mo) layer may not be limited and may be independent of each other. Accordingly, when the thickness of molybdenum (Mo) layer is zero, the multiple layer means a single layer of copper (Cu).

An etching solution for a multiple layer of copper (Cu) and molybdenum (Mo) according to the present invention may include hydrogen peroxide, an organic acid, phosphate, a first additive including nitrogen, a second additive including nitrogen and fluoric compound, which can be prepared by a conventional method and have a purity sufficient for a fabricating process of a semiconductor device, with de-ionized water as solvent. The de-ionized water may have a resistance over about 18 MΩ/cm. Other typical additives used for an etching solution may be added.

Hydrogen peroxide and organic acid are ingredients for etching copper (Cu) and molybdenum (Mo), and have a purity sufficient for a fabricating process of a semiconductor device. For example, hydrogen peroxide and organic acid have metallic impurity density less than 10 ppb (part per billion). Various kinds of organic acid may be used without a specific limitation. For example, acetic acid, butanoic acid, citric acid, formic acid, gluconic acid, glycolic acid, malonic acid, oxalic acid, pentanoic acid and other water-soluble organic acid may be applied as an organic acid.

Organic acid controls the pH value of the etching solution so that the copper (Cu) and molybdenum (Mo) can be etched. If the etching solution includes only hydrogen peroxide without organic acid, the etching solution can not etch copper (Cu). The etching solution including organic acid may have an pH value of about 0.5 to about 4.5.

Phosphate controls a cross-sectional profile of the etched multiple layer, which relates to a taper angle of the etched multiple layer. Various kinds of phosphate may be used without a specific limitation. For example, sodium dihydrogen phosphate, potassium dihydrogen phosphate, where at least one hydrogen of phosphoric acid is substituted with alkali metal or alkaline earth metal, may be used as phosphate. Phosphate reduces an electric effect between copper (Cu) and molybdenum (Mo) to prevent the so-called "undercut phenomenon". For example, in a case where a double layer of a upper copper (Cu) layer and a lower molybdenum (Mo) layer is etched, the lower molybdenum (Mo) layer is etched away by the etching solution in a cross-sectional view, when the undercut phenomenon occurs. If the etching solution does not include phosphate, the upper copper (Cu) layer may be lifted off because the lower molybdenum (Mo) is nearly etched way.

The first additive including nitrogen controls etching speed of a multiple layer of copper (Cu) and molybdenum (Mo) to reduce critical dimension ("CD") loss of patterns, thereby to improve fabrication margin. Various kinds of additives may be used without a specific limitation. For example, aminotetrazole, imidazole, indole, purine, pyrazole, pyridine, pyrimidine, pyrrole, pyrrolidine, pyrroline and other water-soluble cyclic amine compound may be used as the first additive. If the etching solution does not include the first additive, etching speed may not be controllable, and a suitable width of patterns may not be obtained. Accordingly, possibility of device defects and degradation increases, and fabrication margin is reduced. These may cause problems in mass production.

Even though the second additive including nitrogen does not directly relate to a cross-sectional profile or etching speed, the second additive prevents a self-decomposition reaction of hydrogen peroxide, which may occur while the etching solution is stored, and maintains a uniform etching property of the etching solution even after the etching solution is used many times. Various kinds of additives may be used without a specific limitation. Water-soluble compounds including an amino group or a carboxyl group, for example, alanine, aminobutyric acid, glutamic acid, glycine, iminodiacetic acid, nitrilotriacetic acid, sarcosine and their derivatives, may be used as the second additive. In general, when a solution including hydrogen peroxide is stored, a self-decomposition reaction of hydrogen peroxide may occur. Thus, it is hard to store a solution including hydrogen peroxide for a long time, and there is even a possibility of explosion of a vessel containing the solution. However, if the second additive including nitrogen is added to the etching solution, the decomposition speed of hydrogen peroxide can be reduced by about a tenth of its original value. Accordingly, the etching solution which includes hydrogen peroxide can be stored for a longer time with reliability. Moreover, since the second additive represses activation of copper (Cu) ions and molybdenum (Mo) ions, which are generated through a chelation reaction during the etching of copper (Cu) and molybdenum (Mo), an additional reaction due to the ions may be prevented. As a result, a uniform etching property may be maintained even after the etching solution is used many times. Especially, if a large number of copper (Cu) ions exist in the etching solution without the second additive, copper (Cu) ions form a passivation layer, and the passivation layer is oxidized to have black color. The etching solution without the second additive does not etch well the oxidized passivation layer of copper (Cu) ions. However, since the second additive represses activation of copper (Cu) ions, the passivation layer of copper (Cu) ions is not formed when the second additives is added into the etching solution.

A fluoric compound is a main ingredient of an etching solution according to the present invention. The fluoric compound removes residues which are generated in the etching solution when copper (Cu) and molybdenum (Mo) are simultaneously etched. Various kinds of fluoric compounds may be used without a specific limitation. A compound capable of being dissociated into a fluoric ion or polyatomic fluoric ion in a solution, for example, ammonium fluoride, sodium fluoride, potassium fluoride and their bifluoric compound such as ammonium bifluoride, sodium bifluoride and potassium bifluoride, may be used as fluoric compound. In general, an etching solution having a first pH value of about 2 to about 4 has an excellent etching property for copper (Cu), while an etching solution having a second optimum pH value of about 5 to about 7 has an excellent etching property for molybdenum (Mo). To etch copper (Cu) and molybdenum (Mo) together, an etching solution may be adjusted to have one of the first and second optimum pH values. Typically, the pH value of the etching solution is determined according to the thicker layer. Since a copper (Cu) layer is generally thicker than a molybdenum (Mo) layer, the etching solution may have the first pH value of about 2 to about 4. The etching solution having the first pH value of about 2 to about 4 etches well copper (Cu), and also etches molybdenum (Mo) with a relatively slow etching speed. However, molybdenum (Mo) generates residues in the form of a particle due to its own property during an etching step. The residues remain on a glass substrate or a lower layer, and may become the cause of an electrical short or brightness degradation. The fluoric compound removes the molybdenum (Mo) residues in the etching solution. Since the fluoric compound etches the glass substrate and a layer including silicon, the etching solution may include a small amount of fluoric compound such that the glass substrate and the layer including silicon are not etched. For example, about 0.01% to about 1.0% by weight of fluoric compound may sufficiently remove the molybdenum (Mo) residues and may not etch the glass substrate and the layer including silicon.

A conductive line having a multiple layers of copper (Cu) and molybdenum (Mo) may be obtained by using an etching solution according to the present invention. A semiconductor device may be interposed between the substrate and the layers of copper (Cu) and molybdenum (Mo). The semiconductor device may be fabricated through a repetition of photolithographic process and deposition process. In the case of a semiconductor device for a display device such as a liquid crystal display (LCD) device or a plasma display panel (PDP), a dielectric layer and a semiconductor layer including amorphous silicon layer or a polycrystalline silicon layer may be deposited using a chemical vapor deposition (CVD) apparatus, and a conductive layer may be deposited using a sputter apparatus. A gate line and a data line including source and drain electrodes of a thin film transistor (TFT) for the LCD device may be formed to have a multiple layers of copper (Cu) and molybdenum (Mo) using an etching solution according to the present invention. Thus, the RC signal delay of the LCD device may be minimized, and the LCD device may be increased in size.

FIGS. 3A to 3F are schematic cross-sectional views illustrating an etching process of a multiple layer according to an embodiment of the present invention.

Figure 3A:
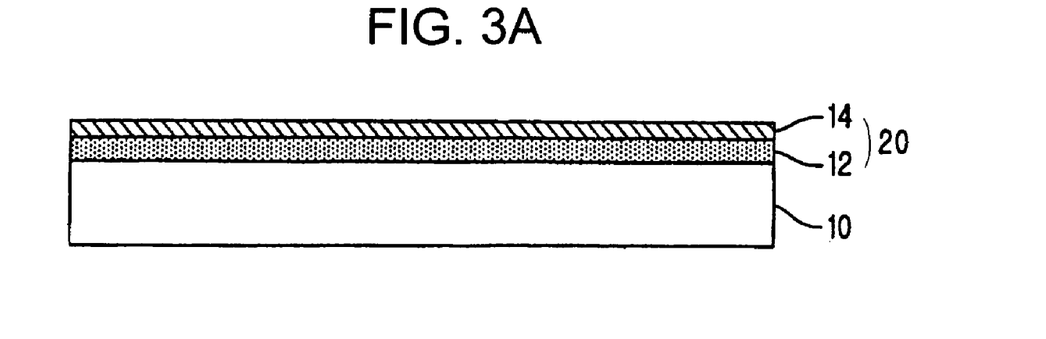
FIGS. 3A to 3F are schematic cross-sectional views illustrating an etching process of a multiple layer according to an embodiment of the present invention.

In FIG. 3A, a molybdenum (Mo) layer 12 and a copper (Cu) layer 14 are sequentially formed on a substrate 10. The molybdenum (Mo) layer 12 and the copper (Cu) layer 14 constitute a multiple layer 20 of copper (Cu) and molybdenum (Mo). The molybdenum (Mo) layer 12 may have a thickness of about 50 Å to about 200 Å and the copper (Cu) layer 14 may have a thickness of about 1500 Å to about 2000 Å. Although not shown in FIG. 3A, a semiconductor device such as a thin film transistor (TFT) may be formed between the substrate 10 and the molybdenum (Mo) layer 12 through repetition of a photolithographic process and a deposition process. The TFT includes a gate electrode, a gate insulating layer, an active layer, an ohmic contact layer, a source electrode, and a drain electrode. A metallic material may be used for the gate electrode, the source electrode, and the drain electrode. An inorganic material such as silicon nitride ($SiN_x$) and silicon oxide ($SiO_2$) may be used for the gate insulating layer. Intrinsic amorphous silicon or intrinsic polycrystalline silicon may be used for the active layer. Impurity-doped amorphous silicon or impurity-doped polycrystalline silicon may be used for the ohmic contact layer. A cleaning process may be performed before and/or after each photolithographic process and deposition process.

Figure 3B:
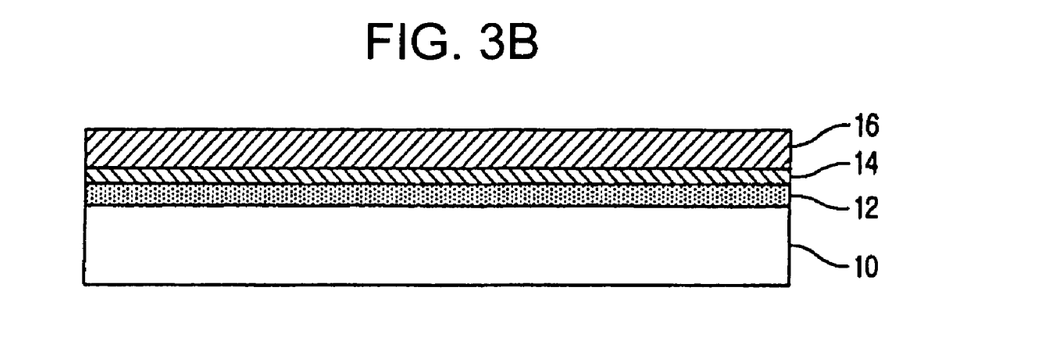

In FIG. 3B, a photoresist (PR) layer 16 is formed on the copper (Cu) layer 14. The PR layer may be a positive type or a negative type.

Figure 3C:
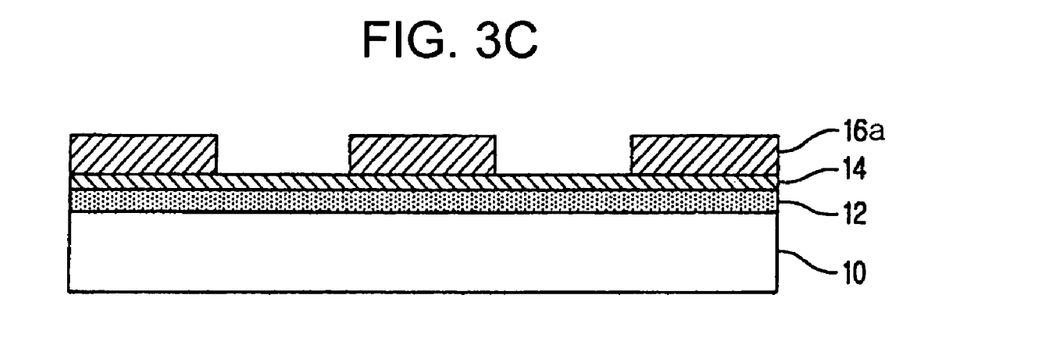

In FIG. 3C, a PR pattern 16a is obtained by exposing and developing the PR layer 16 (of FIG. 3B). Even though not shown in FIG. 3C, a mask is disposed over the PR layer 16 (of FIG. 3B) and the PR layer 16 (of FIG. 3B) is irradiated through the mask. The exposed portion of the PR layer 16 (of FIG. 3B) is removed by the development for the positive type PR, while the exposed portion of the PR layer 16 (of FIG. 3B) remains after the development for the negative type PR. Additional steps such as ashing and annealing may be further performed.

Figure 3D:
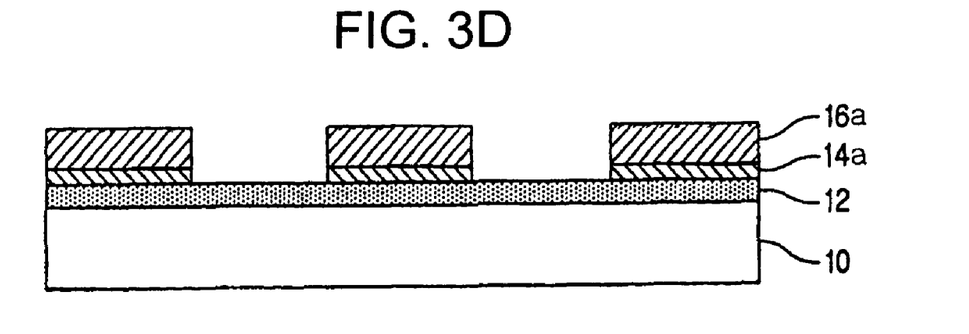

In FIG. 3D, the copper (Cu) layer 14 (of FIG. 3B) is etched with an etching solution to form a copper (Cu) pattern 14a. The etching solution may include about 10% by weight of hydrogen peroxide, about 2% by weight of organic acid, about 1% by weight of phosphate, about 0.5% by weight of a first additive including nitrogen, about 0.5% by weight of a second additive, about 0.05% by weight of a fluoric compound and about 85.95% by weight of de-ionized water.

Figure 3E:
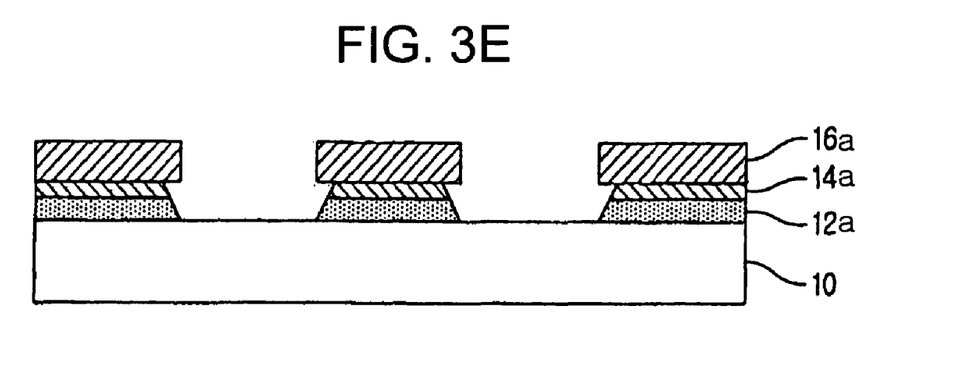

In FIG. 3E, the molybdenum (Mo) layer 12 (of FIG. 3B) is sequentially etched with the same etching solution to form a molybdenum (Mo) pattern 12a. The copper (Cu) layer 14 (of FIG. 3B) and the molybdenum (Mo) layer 16 (of FIG. 3B) may be etched by a dipping method or a spray method. An etching temperature may be determined according to process conditions. For example, the copper (Cu) layer 14 (of FIG. 3B) and the molybdenum (Mo) layer 16 (of FIG. 3B) may be etched under a temperature of about 30° C. The etching time depends on the etching temperature. For example, the copper (Cu) layer 14 (of FIG. 3B) and the molybdenum (Mo) layer 16 (of FIG. 3B) may be etched for about 30 seconds to about 180 seconds.

Figure 3F:
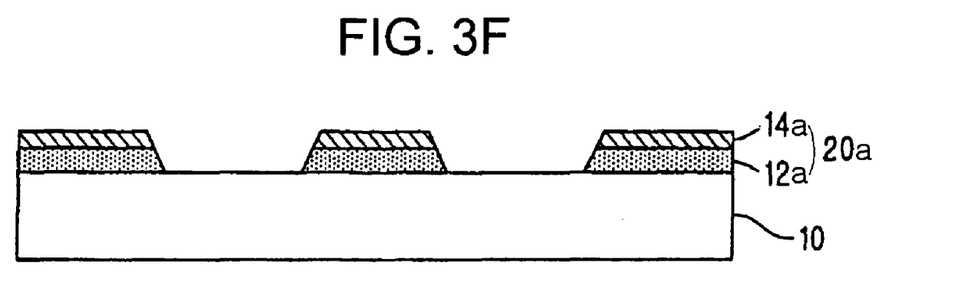

In FIG. 3F, after etching the copper (Cu) layer 14 (of FIG. 3B) and the molybdenum (Mo) layer 16 (of FIG. 3B), the PR pattern 16a (of FIG. 3C) is stripped and a pattern 20a of copper (Cu) and molybdenum (Mo) is obtained. The pattern 20a of copper (Cu) and molybdenum (Mo) may have a taper angle.

The pattern of copper (Cu) and molybdenum (Mo) formed by etching with an etching solution according to the present invention is viewed with a scanning electron microscope (SEM).

Figure 4A:
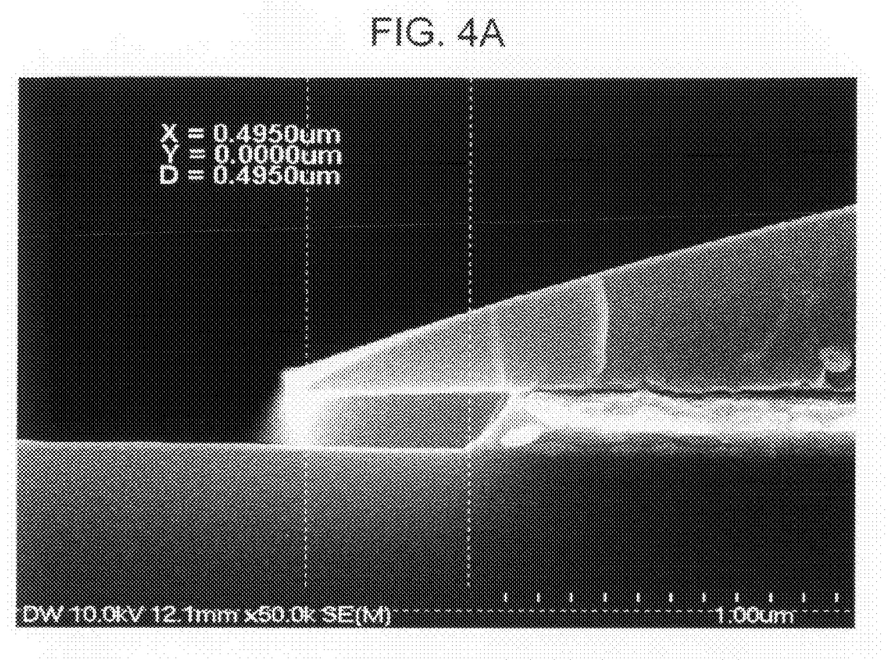
FIG. 4A is a cross-sectional scanning electron microscope (SEM) image showing a pattern of copper (Cu) and molybdenum (Mo) formed by etching with an etching solution according to an embodiment of the present invention.
Figure 4B:
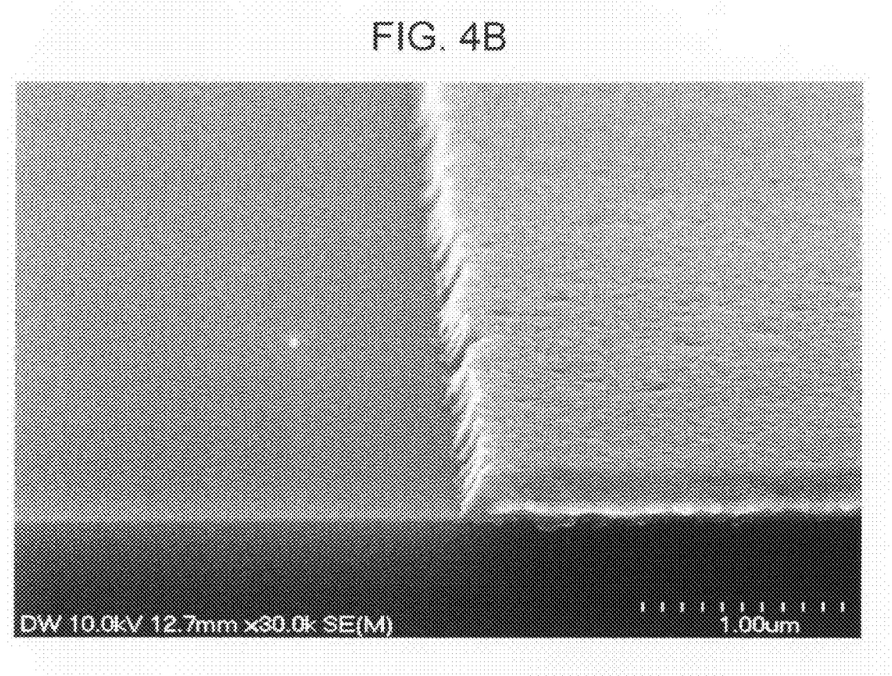
FIG. 4B is a perspective scanning electron microscope (SEM) image showing a pattern of copper (Cu) and molybdenum (Mo) formed by etching with an etching solution according to an embodiment of the present invention.
Figure 4C:
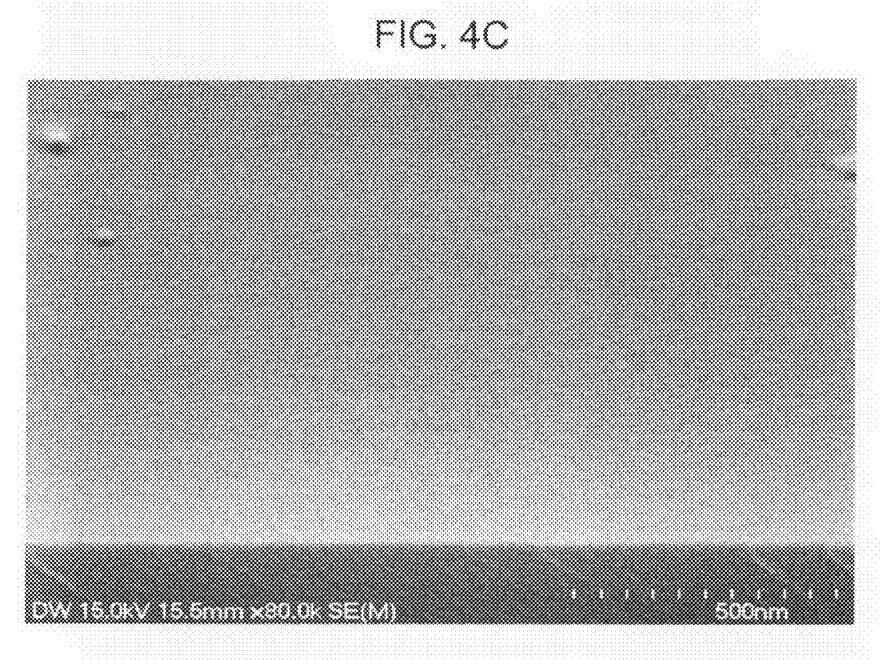
FIG. 4C is a perspective scanning electron microscope (SEM) image showing a substrate after etching with an etching solution according to an embodiment of the present invention.

FIG. 4A is a cross-sectional scanning electron microscope (SEM) image showing a pattern of copper (Cu) and molybdenum (Mo) formed by etching with an etching solution according to an embodiment of the present invention, FIG. 4B is a perspective scanning electron microscope (SEM) image showing a pattern of copper (Cu) and molybdenum (Mo) formed by etching with an etching solution according to an embodiment of the present invention, and FIG. 4C is a perspective scanning electron microscope (SEM) image showing a substrate after etching with an etching solution according to an embodiment of the present invention. Measured etching speeds are about 50 Å/sec and about 7 Å/sec for copper (Cu) and molybdenum (Mo), respectively.

As shown in FIGS. 4A and 4B, the pattern of copper (Cu) and molybdenum (Mo) has an excellent profile and straightness. Moreover, as shown in FIG. 4C, no molybdenum (Mo) residues are observed on the substrate.

Table 1 illustrates etching speeds of copper (Cu) and molybdenum (Mo) obtained by etching with etching solutions having different composition ratio according to embodiments of the present invention.

TABLE 1

| | Compositions (weight %) (hydrogen peroxide/organic acid/phosphate/first additive/second additive/fluoric compound) | Etching speed (Å/sec) | | |
|---|---|---|---|---|
| | | Single layer of Cu | Multiple layer of Cu and Mo | |
| | | | Cu | Mo |
| No. 1 | 10/2/1/0.5/0.5/0.05 | 40~60 | 40~60 | 6~8 |
| No. 2 | 10/5/1/0.5/0.5/0.1 | 60~90 | 60~90 | 5~8 |
| No. 3 | 5/0.5/0.2/0.2/0.2/0.01 | 20~40 | 20~40 | 4~6 |
| No. 4 | 10/1/1/0.5/0.2/0.01 | 40~60 | 40~60 | 6~8 |
| No. 5 | 12/2/2/0.5/1/0.1 | 50~80 | 50~80 | 6~8 |
| No. 6 | 12/2/5/1/1/0.1 | 70~90 | 70~90 | 6~8 |
| No. 7 | 15/2/1/0.5/1/0.1 | 60~90 | 60~90 | 9~12 |
| No. 8 | 15/2/2/5/2/0.1 | 40~60 | 40~60 | 9~12 |
| No. 9 | 15/2/2/1/5/0.1 | 70~100 | 70~100 | 8~11 |
| No. 10 | 17/2/1/0.5/1/0.2 | 60~90 | 60~90 | 8~11 |
| No. 11 | 17/2/2/0.5/0.5/0.1 | 60~90 | 60~90 | 9~11 |
| No. 12 | 20/2/1/2/1/0.1 | 90~110 | 90~110 | 10~12 |
| No. 13 | 20/5/5/5/5/0.2 | 80~120 | 80~120 | 12~15 |
| No. 14 | 25/2/1/0.5/1/0.1 | 100~120 | 100~120 | 10~12 |
| No. 15 | 25/1/1/0.5/0.1/0.1 | 90~110 | 90~110 | 9~11 |
| No. 16 | 25/2/2/2/2/0.1 | 90~110 | 90~110 | 10~12 |
| No. 17 | 25/2/1/0.5/1/0.5 | 100~120 | 100~120 | 10~12 |
| No. 18 | 25/2/1/0.5/1/1 | 100~120 | 100~120 | 11~14 |
| No. 19 | 30/1/0.5/0.5/0.5/0.1 | 100~120 | 100~120 | 10~12 |

As illustrated in Table 1, the etching speed is determined by the amount of hydrogen peroxide and the amount of the first additive including nitrogen. Since all compositions illustrated in Table 1 have sufficient etching speeds, the etching solutions having the compositions can be applied to the etching process of the multiple layers of copper (Cu) and molybdenum (Mo).

With reference to Table 1, the amount of each ingredient is illustrated. Hydrogen peroxide is a main ingredient etching copper (Cu) and molybdenum (Mo). If an etching solution includes hydrogen peroxide less than about 5% by weight, the etching speed is too low and a process time is too long. Accordingly, a reduction in processing time and an excellent profile are obtained by using an etching solution including about 5% to 30% by weight of hydrogen peroxide.

Organic acid controls the pH of an etching solution. If an etching solution includes organic acid less than about 0.5% by weight, the amount of organic acid is too small to control pH value of the etching solution, and the etching solution does not maintain optimum pH value of about 0.5 to about 4.5. Accordingly, an etching solution including about 0.5% to 5% by weight of organic acid maintains an optimum pH value of about 0.5 to about 4.5.

Phosphate prevents an undercut by reducing an electric reaction of copper (Cu) and molybdenum (Mo). If an etching solution includes phosphate less than about 0.2% by weight, an undercut may occur. Accordingly, an excellent taper profile is obtained by using an etching solution including about 0.2% to 5% by weight of phosphate.

The first additive including nitrogen controls etching speed and reduces CD loss. The process margin is determined by the CD loss, and the transmission of electric signals depends on the CD loss. Especially, since a TFT-LCD using a conductive line of a multiple layer of copper (Cu) and molybdenum (Mo) is fabricated to have a large panel size and high brightness, the transmission of electric signals without time delay and interference is a main subject. Moreover, as the CD loss increases, probabilities of straightness reduction and degradation in a subsequent etching process increase. If an etching solution includes the first additive less than about 0.2% by weight, a CD loss is over 5% of a pattern so that an excellent pattern can not be obtained. Accordingly, a reduced CD loss and an excellent taper profile is obtained by using an etching solution including about 0.2% to 5% by weight of the first additive including nitrogen.

The second additive including nitrogen increases a storing time of an etching solution and maintains a uniform etching property of an etching solution even after the etching solution is used many times. In general, it is hard to store a solution including hydrogen peroxide for a long time due to a self-decomposition reaction of hydrogen peroxide. Moreover, copper (Cu) ions form a passivation layer. The passivation layer is oxidized to have black color, and the oxidized passivation layer of copper (Cu) ions is not etched with an etching solution. The second additive lengthens the storage time of an etching solution by reducing self-decomposition of hydrogen peroxide and prevents formation of a passivation layer by reducing activation of copper (Cu) ions through chelation reaction. If an etching solution includes the second additive less than about 0.2% by weight, a passivation layer is formed after etching, for example, about 500 substrates so that a sufficient utilization of the etching solution can not be obtained. Accordingly, a sufficient storing time and a sufficient utilization are obtained by using an etching solution including about 0.2% to 5% by weight of the second additive.

A fluoric compound removes molybdenum (Mo) residues generated in an etching solution having a pH value of about 0.5 to about 4.5. The molybdenum (Mo) residues cause an electrical short and degradation of conductive lines, thereby reducing brightness. If an etching solution includes fluoric acid less than about 0.01% by weight, molybdenum (Mo) residues remain as shown in FIG. 2C. Accordingly, molybdenum (Mo) residues are prevented without damaging layers including silicon by using an etching solution including about 0.01% to about 1.0% by weight of fluoric compound.

Figure 5A:
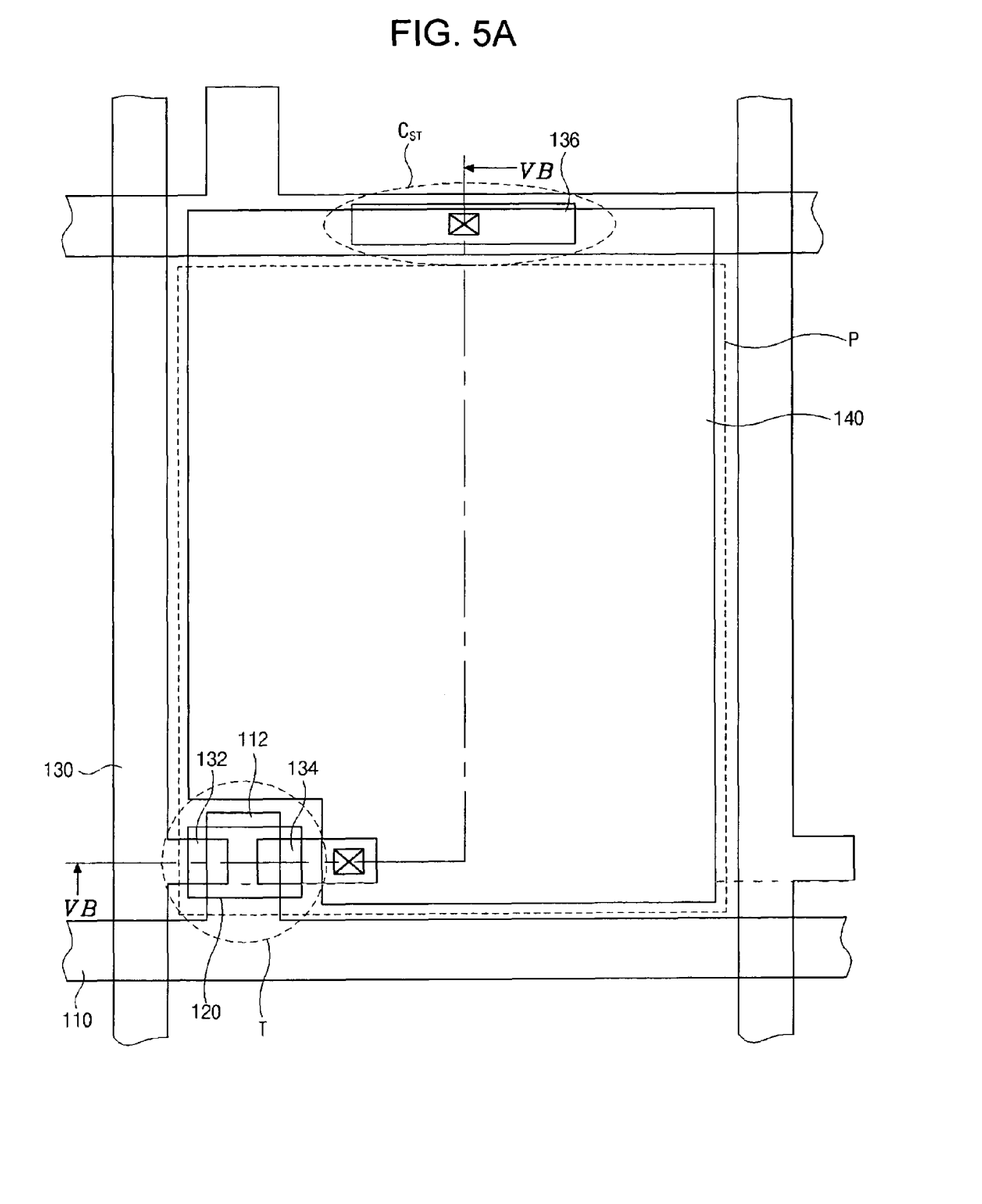
FIG. 5A is a schematic view showing an array substrate for a liquid crystal display device fabricated by using an etching solution according to an embodiment of the present invention.
Figure 5B:
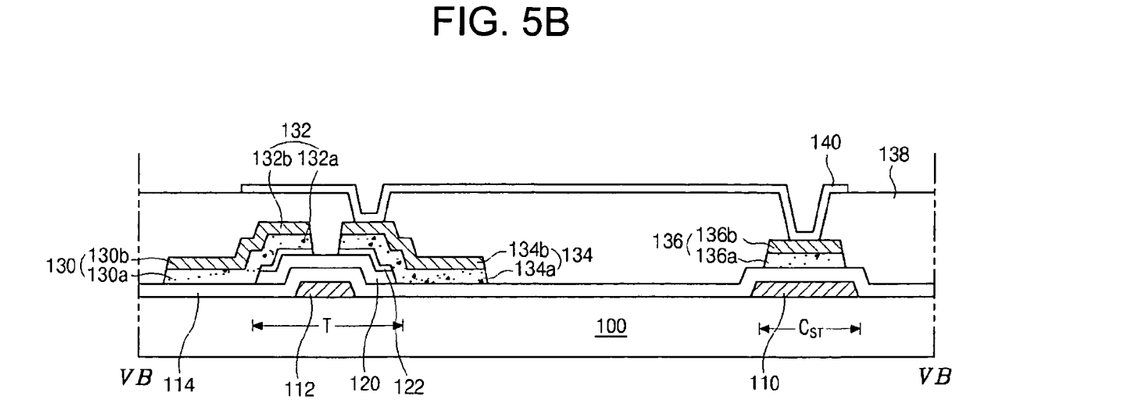
FIG. 5B is a cross-sectional view taken along the line "VB-VB" of FIG. 5A.

FIG. 5A is a plane view showing an array substrate for a liquid crystal display device fabricated using an etching solution according to an embodiment of the present invention and FIG. 5B is a cross-sectional view taken along the line "VB-VB" of FIG. 5A.

In FIGS. 5A and 5B, a gate line 110 and a gate electrode 112 are formed on a substrate 100. A buffer layer of an insulating material may be formed between the substrate 100 and the gate line 110 and a cleaning process may be performed before forming the gate line 110. A gate insulating layer 114 is formed on the gate line 110 and the gate electrode 112. An active layer 120 of a semiconductor material such as amorphous silicon is formed on the gate insulating layer 114 over the gate electrode 112, and an ohmic contact layer 122 of an impurity doped semiconductor material is formed on the active layer 120.

A data line 130 and a storage electrode 136 are formed on the gate insulating layer 114 and a source electrode 132 and a drain electrode 134 are formed on the ohmic contact layer 122. The data line 130 crosses the gate line 110 to define a pixel region "P" and the source 132 and drain electrodes 134 are spaced apart from each other. The storage electrode 136 overlaps a portion of the gate line 110 to constitute a storage capacitor "$C_{ST}$." The data line 130, the source electrode 132, the drain electrode 134 and the storage electrode 136 may be simultaneously formed of a multiple layer of copper (Cu) and molybdenum (Mo) using an etching solution including hydrogen peroxide, organic acid, phosphate, a first additive, a second additive, a fluoric compound and de-ionized water. In other words, the data line 130 includes a data molybdenum (Mo) layer 130a and a data copper (Cu) layer 130b, the source electrode 132 includes a source molybdenum (Mo) layer 132a and a source copper (Cu) layer 132b, and the drain electrode 134 includes a drain molybdenum (Mo) layer 134a and a drain copper (Cu) layer 134b, and the storage electrode 136 includes a storage molybdenum (Mo) layer 136a and a storage copper (Cu) layer 136b. Each of the data line 130, the source electrode 132, the drain electrode 134 and the storage electrode 136 has a taper profile with a substantially small amount of molybdenum (Mo) residues after etching, thereby improving characteristics of a liquid crystal display device.

A passivation layer 138 of an insulating material is formed on the data line 130, the source electrode 132, the drain electrode 134 and the storage electrode 136 and a pixel electrode 140 is formed on the passivation layer 138. The pixel electrode 140 is connected to the drain electrode 134 and the storage electrode 136.

In this embodiment, only the data line 130, the source electrode 132, the drain electrode 134 and the storage electrode 136 are formed of a multiple layer of copper (Cu) and molybdenum (Mo) as shown in FIGS. 5A and 5B. However, it should be understood that the gate line 110 and the gate electrode 112 may be formed of a multiple layer of copper (Cu) and molybdenum (Mo). Moreover, in this embodiment, a double layer of copper (Cu) and molybdenum (Mo) is used for the data line 130, the source electrode 132, the drain electrode 134 and the storage electrode 136 as shown in FIGS. 5A and 5B. It should be further understood that a multiple layer including more than two layers of copper (Cu) and molybdenum (Mo) may be used. A copper (Cu) layer and a molybdenum (Mo) layer may be formed by a physical vapor deposition (PVD) method using a sputter. In addition, an etching solution according to the present invention may be used for etching a single layer of copper (Cu).

In sum, an etching solution and an etching method using the etching solution according to the present invention have several advantages.

Etching speed can be easily controlled, and an excellent taper profile having a taper angle of about 30° to about 60° and an excellent straightness of conductive lines are obtained. In addition, an etching solution maintains a uniform etching property such as etching speed even after the etching solution is used many times. The etching solution can be stored for a long time period without change of etching property. Moreover, since molybdenum (Mo) residues generated in an etching solution having a pH value of about 0.5 to about 4.5 do not remain, electrical shorts and line defects are prevented. Thus, the brightness of an LCD device is improved. Therefore, a large-size LCD device having a high brightness is obtained by etching a multiple layer of copper (Cu) and molybdenum (Mo) with an etching solution according to the present invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An etching method for a multiple layer of copper and molybdenum, comprising:
    forming the multiple layer of copper and molybdenum on a substrate;
    forming a photoresist pattern on the multiple layer; and
    etching the multiple layer with an etching solution including: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and de-ionized water making a total amount of the etching solution 100% by weight.

2. The method according to claim 1, wherein the multiple layer is a double layer including a lower molybdenum layer and an upper copper layer.

3. The method according to claim 2, wherein the upper copper layer is thicker than the lower molybdenum layer.

4. The method according to claim 1, wherein the substrate is a glass substrate for a liquid crystal display device.

5. The method according to claim 1, wherein the multiple layer is used as a data line for a liquid crystal display device.

6. A method for fabricating an array substrate for a liquid crystal display device, comprising:
    forming a gate electrode and a gate line on a substrate;
    forming a semiconductor layer on the gate electrode and the gate line; and
    forming source and drain electrodes on the semiconductor layer and a data line crossing the gate line, wherein at least one of the gate line and the data line is a multiple layer of copper and molybdenum, and etching of the multiple layer is performed with an etching solution including: about 5% to about 30% by weight of a hydrogen peroxide; about 0.5% to about 5% by weight of an organic acid; about 0.2% to about 5% by weight of a phosphate; about 0.2% to about 5% by weight of a first additive having nitrogen; about 0.2% to about 5% by weight of a second additive having nitrogen; about 0.01% to about 1.0% by weight of a fluoric compound; and about 45% to about 93.89% by weight of de-ionized water.

7. The method according to claim 6, wherein the multiple layer is a double layer including a lower molybdenum layer and an upper copper layer.

8. The method according to claim 7, wherein the upper copper layer is thicker than the lower molybdenum layer.

9. A method for fabricating an array substrate for a liquid crystal display device, comprising:
    forming a gate electrode and a gate line on a substrate;
    forming a semiconductor layer on the gate electrode and the gate line;
    forming source and drain electrodes on the semiconductor layer and a data line crossing the gate line, wherein at least one of the gate line and the data line is a multiple layer including at least one of copper layer and molybdenum layer; and
    etching the multiple layer with an etching solution, wherein an etching solution includes: hydrogen peroxide to etch the copper layer; fluoric compound to etch the molybdenum layer; organic acid to control a pH value of the etching solution; a first additive to control an etching speed; and a phosphate to control a taper angle of the multiple layer.

10. The method according to claim 9, wherein the multiple layer includes molybdenum (Mo) layer and copper (Cu) layer.

11. The method according to claim 9, wherein the multiple layer includes a bottom molybdenum (Mo) layer, a middle copper (Cu) layer, and a top molybdenum (Mo) layer.

12. The method according to claim 9, wherein the multiple layer includes a plurality of molybdenum (Mo) layers and a plurality of copper (Cu) layers.

13. The method according to claim 10, wherein the copper (Cu) layer is thicker than the molybdenum (Mo) layer.

14. The method according to claim 9, wherein a taper angle of the multiple layer is in a range of about 30 degrees to about 60 degrees.

15. The method according to claim 9, further comprising forming a storage electrode overlapping with the gate line to form a storage capacitor.

* * * * *